United States Patent
Bijnen et al.

(10) Patent No.: US 8,208,121 B2
(45) Date of Patent: Jun. 26, 2012

(54) ALIGNMENT MARK AND A METHOD OF ALIGNING A SUBSTRATE COMPRISING SUCH AN ALIGNMENT MARK

(75) Inventors: Franciscus Godefridus Casper Bijnen, Valkenswaard (NL); Manfred Gawein Tenner, Eindhoven (NL); Patrick Warnaar, Tilburg (NL); Marc Van Kemenade, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 638 days.

(21) Appl. No.: 12/363,320

(22) Filed: Jan. 30, 2009

(65) Prior Publication Data

US 2009/0195768 A1    Aug. 6, 2009

Related U.S. Application Data

(60) Provisional application No. 61/006,841, filed on Feb. 1, 2008.

(51) Int. Cl.
*G03B 27/42* (2006.01)
*G03B 27/58* (2006.01)

(52) U.S. Cl. .............................. 355/53; 355/72; 356/401
(58) Field of Classification Search ................. 355/53, 355/72–74, 75; 356/400, 401, 490
See application file for complete search history.

(56) References Cited

U.S. PATENT DOCUMENTS

| 3,683,195 A | 8/1972 | Johannsmeier et al. |
| 4,103,998 A | 8/1978 | Nakazawa et al. |
| 4,353,087 A | 10/1982 | Berry et al. |
| 4,611,122 A | 9/1986 | Nakano et al. |
| 4,980,718 A | 12/1990 | Salter et al. |
| 5,721,619 A | 2/1998 | Hiruma et al. |
| 5,751,403 A | 5/1998 | Mizutani et al. |
| 5,917,205 A | 6/1999 | Mitsui et al. |
| 6,699,624 B2 | 3/2004 | Niu et al. |
| 7,038,777 B2 | 5/2006 | Kim et al. |
| 7,046,361 B1 * | 5/2006 | Yang et al. ............ 356/401 |
| 7,440,105 B2 | 10/2008 | Adel et al. |

(Continued)

FOREIGN PATENT DOCUMENTS

EP    1 372 040 A2    12/2003

(Continued)

OTHER PUBLICATIONS

English-Language Translation of Notice of Reasons for Rejection directed to related Japanese Patent Application No. 2009-019370, mailed Jun. 8, 2011, the Japanese Patent Office; 5 pages.

*Primary Examiner* — Edward Glick
*Assistant Examiner* — Michelle Iacoletti
(74) *Attorney, Agent, or Firm* — Sterne, Kessler, Goldstein & Fox P.L.L.C

(57) ABSTRACT

An alignment mark comprising a periodic structure formed by mark lines is described. In an embodiment, the alignment mark is formed in a scribe lane of a substrate, the scribe lane extending in a scribe lane direction. The alignment mark includes: a first area including a first periodic structure formed by first mark lines extending in a first direction, the first direction being at a first angle $\alpha$ with respect to the scribe lane direction: $0°<\alpha<90°$ and a second area comprising second periodic structure formed by second mark lines extending in a second direction, the second direction being at a second angle $\beta$ with respect to the scribe lane direction: $-90°\leq\beta<0°$.

34 Claims, 11 Drawing Sheets

U.S. PATENT DOCUMENTS

| | | |
|---|---|---|
| 7,687,925 B2 | 3/2010 | Marokkey et al. |
| 7,879,627 B2 | 2/2011 | Ghinovker et al. |
| 7,898,662 B2 | 3/2011 | Van Der Schaar et al. |
| 2006/0061743 A1 | 3/2006 | Den Boef et al. |

FOREIGN PATENT DOCUMENTS

| | | |
|---|---|---|
| JP | 52-012577 A | 1/1977 |
| JP | 53-048077 B | 12/1978 |
| JP | 56-017017 A | 2/1981 |
| JP | 59-099721 A | 6/1984 |
| JP | 62-060223 A | 3/1987 |
| JP | 63-005204 A | 1/1988 |
| JP | 63-164316 A | 7/1988 |
| JP | 01-503100 A | 10/1989 |
| JP | 02-005011 B2 | 1/1990 |
| JP | 04-046537 A | 2/1992 |
| JP | 05-206008 A | 8/1993 |
| JP | 07-335529 A | 12/1995 |
| JP | 08-306613 A | 11/1996 |
| JP | 08-306620 A | 11/1996 |
| JP | 09-102457 A | 4/1997 |
| JP | 09-166866 A | 6/1997 |
| JP | 10-284404 A | 10/1998 |
| JP | 2000-200751 A | 7/2000 |
| JP | 2004-508711 A | 3/2004 |
| JP | 2004-519716 A | 7/2004 |
| JP | 2006-114919 A | 4/2006 |
| JP | 2007-073970 A | 3/2007 |
| JP | 2007-527531 A | 9/2007 |
| JP | 2008-021984 A | 1/2008 |

* cited by examiner

Grid A, α          Grid A, -α          Grid B, α          Grid B, -α ed radiation onto a substrate having a radiation-sensitive layer thereon and detecting a position of the substrate using an alignment mark as described above.

ALIGNMENT MARK AND A METHOD OF ALIGNING A SUBSTRATE COMPRISING SUCH AN ALIGNMENT MARK

CROSS-REFERENCE TO RELATED APPLICATIONS

The present application claims the benefit of U.S. Provisional Patent Appl. No. 61/006,841, filed Feb. 1, 2008, which is incorporated by reference herein in its entirety.

BACKGROUND

1. Field

Embodiments of the present invention relate generally to an alignment mark, a method of aligning a substrate including such an alignment mark, a substrate including such an alignment mark, a device manufacturing method and a device manufactured accordingly.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to transfer the pattern onto the target portion with high accuracy, the position of the target portion needs to be measured before transfer. To do this, the substrate may include alignment marks, for instance formed in scribe lanes in between target portions, of which the position can be measured using alignment sensors. The alignments marks may also be referred to as scribe lane marks. The alignment marks may thus be used to position the substrate with respect to for instance a projection system and the patterning device.

Usually, different types of alignment marks are provided. A first alignment mark may be provided for determining a position in a first direction (e.g. x-direction) and a second alignment mark may be provided for determining a position in a second direction (e.g. y-direction). In practice, usually a number of first and second alignment marks are provided for accurate position determination.

Scribe lane marks may be used because they can be exposed in the scribe lane together with the product image alongside a neighboring product image. These scribe lane marks can be used for one alignment direction (X or Y). Detection of two separate marks at a different moment and location is cause for small metrology errors. Furthermore the area occupied for alignment is perceived as too large and the time required to align segments in two directions is too long.

Intrafield alignment (for intrafield exposure correction) is only possible in the direction of the scribe lane and is therefore missing one direction. Only at the cost of cross-talk or for using wide scribe lanes can the alignment information in the direction perpendicular to the scribe lane be obtained.

In general there is a need for better reproduction of alignment to allow better overlay for double patterning and exposure.

Accordingly, a number of problems are identified according to the state of the art:

System overlay would benefit from better reproduction;
Alignment mark area is relatively large;
Current scribe lane marks have separate X and Y alignment positions, which can cause small overlay errors;
Current detection of a mark in a specific orientation (X or Y) is corresponding to movement of the stage along the axis causing most interferometer noise (air flow) instead of determining the position in the non-scanning direction, which may result in a bit lower noise level; and
Currently intrafield alignments in the direction perpendicular to the scribe lane can not properly be performed and alignment of X and Y positions in the same scribe lane is not possible in a practical way.

SUMMARY

An alignment mark is provided that overcomes at least one of the above mentioned problems.

In an embodiment, there is provided an alignment mark including a periodic structure formed by mark lines, the alignment mark being formed in a scribe lane of a substrate, the scribe lane extending in a scribe lane direction, the alignment mark including:

a first area including a first periodic structure formed by first mark lines extending in a first direction, the first direction being at a first angle $\alpha$ with respect to the scribe lane direction: $0° < \alpha < 90°$ and a second area including a second periodic structure formed by second mark lines extending in a second direction, the second direction being at a second angle $\beta$ with respect to the scribe lane direction: $-90° \leq \beta < 0°$.

According to an aspect there is provided a method of aligning a substrate including such an alignment mark, the method including:

performing a fine alignment scan of the alignment mark in a direction substantially parallel to the scribe lane direction using a self-referencing alignment sensor, resulting in a fine alignment signal including first and second superimposed periodic fine alignment sub-signals, determining a first fine alignment position of the first fine alignment sub-signal and determining a second fine alignment position of the second fine alignment sub-signal, determining a position of the alignment mark in a direction substantially parallel to the scribe lane direction by averaging the first and second fine alignment positions, and determining a position of the alignment mark in a direction substantially perpendicular to the scribe lane direction by computing a difference between the first and second fine alignment positions. Averaging in determining positions of the alignment marks may be done by weighted averaging.

According to an embodiment, before performing a fine alignment scan, at least one capture alignment scan of the alignment mark is performed.

According to an embodiment, a substrate is provided including an alignment mark according to the above.

According to an embodiment, a device manufacturing method is provided including projecting a patterned beam of radiation onto a substrate, wherein the device manufacturing method includes one of the methods according to the above.

According to an embodiment there is provided a device manufactured according to the method as described above.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 1 schematically depicts a lithographic apparatus according to an embodiment of the invention.

FIG. 2 schematically depicts an alignment mark according to an embodiment.

FIG. 3 schematically depicts a subsegmented alignment mark according to an embodiment.

FIGS. 4a and 4b schematically depict shifts of alignment position with respect to the center of the mark X0, for one type of oblique grating for two values of Yoff, according to an embodiment of the invention.

FIG. 5 schematically depicts a scan result along the central Y=0 position along the x-direction, showing the interference of two gratings according to an embodiment of the invention.

FIGS. 6, 7, and 8 schematically depict alignment marks according to further embodiments.

FIG. 9a schematically depicts a signal contour according to an embodiment.

FIGS. 9b and 9c schematically depict illustrations of operations according to an embodiment.

FIGS. 10-18 schematically depict measured and computed data according to embodiments.

FIG. 19 schematically depicts a further embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus according to one embodiment of the invention. The apparatus includes:
- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to radiation beam B by patterning device MA onto a target portion C (e.g. including one or more dies) of substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD including, for example, suitable directing mirrors and/or a beam expander. In other cases the source may be an integral part of the lithographic apparatus, for example when the source is a mercury lamp. Source SO and illuminator IL, together with beam delivery system BD if required, may be referred to as a radiation system.

Illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may include various other components, such as an integrator IN and a condenser CO. The illuminator may be used to condition the radiation beam, to have a desired uniformity and intensity distribution in its cross-section.

Radiation beam B is incident on the patterning device (e.g., mask MA), which is held on the support structure (e.g., mask table MT), and is patterned by the patterning device. Having traversed mask MA, radiation beam B passes through projection system PS, which focuses the beam onto a target portion C of substrate W. With the aid of second positioner PW and position sensor IF2 (e.g. an interferometric device, linear encoder or capacitive sensor), substrate table WT can be moved accurately, e.g. so as to position different target portions C in the path of radiation beam B. Similarly, first positioner PM and another position sensor IF1 can be used to accurately position mask MA with respect to the path of radiation beam B, e.g. after mechanical retrieval from a mask library, or during a scan. In general, movement of mask table MT may be realized with the aid of a long-stroke module (coarse positioning) and a short-stroke module (fine positioning), which form part of first positioner PM. Similarly, movement of substrate table WT may be realized using a long-stroke module and a short-stroke module, which form part of second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on mask MA, the mask alignment marks may be located between the dies.

The depicted apparatus could be used in at least one of the following modes:

1. In step mode, mask table MT and substrate table WT are kept essentially stationary, while an entire pattern imparted to the radiation beam is projected onto a target portion C at one time (i.e. a single static exposure). Substrate table WT is then shifted in the X and/or Y direction so that a different target portion C can be exposed. In step mode, the maximum size of the exposure field limits the size of the target portion C imaged in a single static exposure.

2. In scan mode, mask table MT and substrate table WT are scanned synchronously while a pattern imparted to the radiation beam is projected onto a target portion C (i.e. a single dynamic exposure). The velocity and direction of substrate table WT relative to mask table MT may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, mask table MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Alignment Sensor

An example of an alignment sensor is a transmission image sensor, used to determine the positions of a mask and a substrate relative to each other. The mask includes a mask mark. An image of the mask mark is formed by the projection system onto a Transmission Image Sensor (TIS) placed in a substrate table, the image formed using a radiation beam. The Transmission Image Sensor (TIS) includes a grating structure with transmissive and reflective (or absorbing) elements (for instance a transmissive pattern in a layer of chromium). When the image is in focus at and aligned with a grating structure, the transmissive elements correspond to the image. A detector (such as a photodiode) is positioned behind the grating structure, said detector being constructed to measure the intensity of the radiation behind the grating structure.

If the image is in focus at and aligned with the structure, all radiation passes through the structure, resulting in a maximal intensity at the detector. If the image is not in focus at the grating structure or is misaligned with the structure, part of the radiation falls onto the reflective (or absorbing) elements and the intensity measured by the detector behind the structure will be lower.

At several relative positions between the mask and the substrate stage intensities of radiation that has passed the mask mark and the grating are measured by the detector to find the position where the measured intensity is maximal. This relative position corresponds with the mask mark being in focus at and aligned with the structure of the Transmission Image Sensor (TIS). Alternative embodiments may be possible. For instance a mark may be provided on the mask table or on a fiducial part on the mask table in order to align the mask table to the substrate table. Also several marks may be present on the mask or on the mask table or several fiducial parts may be present on the mask table to qualify the projection system. This may for instance be done by determining the magnification of the projection system by measuring the positions of the images of several mask marks on the mask one by one using the grating structure and the detector and comparing the distance between the measured positions with the distance of the several marks on the mask. Also, several grating structures may be present on the substrate table to determine rotation of the mask relative to the substrate table.

Another type of alignment sensor that may be used is a diffraction alignment sensor that measures a position of an alignment mark. During alignment, the alignment mark is illuminated with an alignment beam of radiation. The alignment beam of radiation is diffracted by the alignment mark into several diffraction orders, such as +1, −1, +2 and −2. Using optical elements, each set of corresponding diffraction orders (say +1 and −1) is used to form an image of the alignment mark onto a reference plate. The reference plate includes reference gratings for each set of corresponding diffraction orders to be measured. Behind each reference grating a separate detector is arranged to measure the intensity of the radiation in the image passing through the reference gratings. By moving the alignment mark relative to the reference plate, the position with the highest intensity for one or more images is found, which gives the aligned position.

To enhance performance, the intensity of several images can be measured and the alignment beam of radiation can consist of multiple colours.

Another type of alignment sensor is a self-referencing sensor, which is for instance explained in detail in European patent no. EP 1 372 040, which is incorporated by reference herein in its entirety.

EXEMPLARY EMBODIMENTS

In the description of the embodiments, a difference is made between fine alignment and capture alignment. As used herein, capture alignment is performed to "find" the mark and fine alignment is performed to determine the position of the mark. Usually, when a substrate is positioned on a stage, first a capture alignment is performed to determine where the mark is, and based on the outcome of the capture alignment, a more accurate fine alignment can be performed. Capture alignment results in a measured capture position of the alignment mark, and fine alignment results in a measured fine position of the alignment mark, where the fine alignment position is more accurate than the capture alignment position.

Exemplary Embodiment 1

In an embodiment, an alignment mark AM is provided, including a periodic structure formed by mark lines, the mark being formed in a scribe lane of a substrate, the scribe lane extending in a scribe lane direction, the mark including:
  a first area including a first periodic structure formed by first mark lines extending in a first direction, the first direction being at a first angle α with respect to the scribe lane direction: $0°<α<90°$ and
  a second area including a second periodic structure formed by second mark lines extending in a second direction, the second direction being at a second angle β with respect to the scribe lane direction: $-90°<β<0°$. As will be explained in a further embodiment below, according to a further embodiment: $-90°≦β<0°$.

The embodiments below describe a number of variations for such an alignment mark AM.

FIG. 2 schematically depicts an alignment mark AM according to an embodiment. Alignment mark AM may be positioned in a scribe lane. Scanning of the alignment mark AM takes place along the length of the mark, i.e. in a scribe lane direction.

Alignment mark AM includes a periodic structure formed by mark lines ML, alignment mark AM being formed in a scribe lane of a substrate W, the scribe lane extending in a scribe lane direction. The alignment mark includes:
  a first area I including a first periodic structure formed by first mark lines ML extending in a first direction, the first direction being at a first angle α with respect to the scribe lane direction: $0°<α<90°$,
  a second area II including a second periodic structure formed by second mark lines ML extending in a second direction, the second direction being at a second angle β with respect to the scribe lane direction: $-90°<β<0°$, and
  a third area III including a third periodic structure, the third periodic structure being similar to the second periodic structure. Again, as will be explained in a further embodiment below, according to a further embodiment: $-90°≦β<0°$.

The first periodic structure may have a first pitch A, and the second and third periodic structure may have a second pitch B.

The first area is adjacent to the second and third area.

The scribe lane direction is substantially parallel to or perpendicular to the scanning direction.

FIG. 3 shows an example of how the alignment structure (of alignment mark AM shown in FIG. 2) can be sub-segmented. FIG. 3 shows that the oblique mark lines ML can be formed by a number of sub-mark lines that are not oblique, but which are in the direction of the scan direction or scribe lane direction, which allows easy formation. Other orientations or a polar design are also possible. At sub-wavelength segmentation this structure acts as a normal alignment structure. It is relatively easily exposed (in contrast to solid oblique lines).

So, according to an embodiment, the mark lines are formed by a plurality of sub-segment lines extending parallel or perpendicular with respect to the scribe lane direction. According to another embodiment, the mark lines are formed by a plurality of sub-segment lines in a polar design.

Alignment mark AM as shown in FIG. 2 has an inversion symmetry (180 degrees rotation) which allows alignment with a self referencing alignment sensor. Alignment by another sensor (e.g., a diffraction alignment sensor or a Through The Lens Type (TTL) alignment sensor) would beneficially make use of a grating structure similar to the mark shape.

An alignment scan substantially in the scribelane direction over the alignment mark as shown in FIG. 3 gives two periodic signals:

$$\text{Pitch\_meas\_}A = (\text{pitch }A)/|\sin \alpha| \quad (1)$$

and $$\text{Pitch\_meas\_}B = (\text{pitch }B)/|\sin \beta| \quad (2).$$

According to this embodiment, the first periodic structure has a first period and the second periodic structure has a second period, the first period differing from the second period.

These two signals can be detected and distinguished from each other by
the electronics of the self-referencing sensor;
additionally by a dedicated mask/reference mark (TTL); or additionally by
a dedicated spatial separation (modified Diffraction alignment sensor type).

Thus two alignment positions (Xa and Xb) are found. Referring to FIGS. 4a and 4b, suppose scanning takes place in the X direction and when scanning over a central axis of the mark (Y0) the design of the mark is such that the positions Xa and Xb can be made identical. This is defined as the centre of the mark: X0. When aligning with an offset in the Y direction (Yoff) the aligned positions are shifted in opposite directions of the central position X0.

The shifts of alignment position Xa with respect to the centre of the mark X0, for one type of oblique grating, is illustrated in FIGS. 4a and 4b for two values of Yoff.

When alignment is performed with an offset Yoff between the reference image/grating and the mark on substrate W, then the two different alignment positions are found corresponding to:

$$Xa = X0 + Yoff/(\tan \alpha) \quad (3)$$

$$Xb = X0 + Yoff/(\tan \beta) \quad (4)$$

In case $\alpha$ and $\beta$ have different signs (as in FIG. 2) the two alignment positions are displaced in opposite directions with respect to the central alignment position. The equations 3 and 4 can be solved for X0 and Yoff since all other parameters are known from design ($\alpha$ and $\beta$) or measured ($X_a$ and $X_b$):

$$X_0 = \frac{\tan\alpha * X_a - \tan\beta * X_b}{\tan\alpha - \tan\beta} \quad (5)$$

$$Y_{off} = \tan\alpha * \tan\beta \frac{X_b - X_a}{\tan\alpha - \tan\beta} \quad (6)$$

When using a grating as reference for the alignment (e.g., diffraction alignment sensor, TTL alignment sensor) the value Yoff directly corresponds to the offset to be corrected by the stage to align the alignment mark AM at its centre position Y0:

$$Yoff\_stage\_refgrat = Yoff. \quad (7)$$

For a self-referencing sensor, because of the self-referencing principle, the stage is a distance $$Yoff\_stage\_selfref = Yoff/2 \quad (8)$$

away from the alignment position. The central alignment mark position Y0 can be found by $$Y0 = Y\text{interferometer} - Y\_off\_stage. \quad (9)$$

A preferred situation occurs for $$\beta = -\alpha \quad (10)$$

In that case (from equation 5)

$$X0 = (Xa + Xb)/2 \quad (11)$$

and $$Yoff = \tan \alpha * (Xb - Xa)/2 \quad (12).$$

These are the final equations describing the examples in the table below.

Error Budget Considerations

The error in the aligned positions Xa and Xb includes sensor noise, interferometer noise in scanning direction/scribe lane direction (x), modeling noise and/or a new term which is interferometer noise in the non scanning direction (y).

One (beneficial) uncertainty is that the stage will not disturb the air as much in the non-scanning as in the scanning direction. Another (non-beneficial) argument is that the alignment position in X of a grid with a shallow slope is more sensitive for noise in of the actual stage position in Y. The errors in Xa and Xb will be a function of the angle $\alpha$: $\delta x(\alpha)$.

The error in X0 can now be calculated from equation 11:

$$\delta X_0 = \frac{\delta x(\alpha)}{\sqrt{2}} \quad (13)$$

The error in the position of Y0 for reference grating alignment systems (for instance the diffraction alignment system described above) is derived from equations 7, 9, and 12 (errors to be summed quadratically in first approximation)

$$\delta Y0\_refgrat = \tan\alpha \frac{\delta x(\alpha)}{\sqrt{2}} + \delta Y\text{interferometer\_non\_scan} \quad (14)$$

and for self-referencing systems the situation is more beneficial (from equations 8, 9 and 12):

$$\delta Y0\_selfref = \tan\alpha \frac{\delta x(\alpha)}{2*\sqrt{2}} + \delta Y\text{interferometer\_non\_scan}. \quad (15)$$

As an example, for the simple case that $\delta x = 1$ nm and $\delta y = 0.1$ nm, Table 1 is set up according to equations 1, 2, 3, 4, 11, 12, 13, 14.

TABLE 1

Typical examples employing leveraging XY scribe lane marks.

| INPUT | | | | | |
|---|---|---|---|---|---|
| dx nm | | dY_interfer_non scanning nm | | | |
| 1.2 | | 0.5 | | | |
| Induced positions-offset | | Angle of grating tilt | | Original qrating pitches | |
| X0 um | Yoff um | alfa (rad) rad | beta (rad) rad | pitch A um | pitch B um |
| example 1    0.00 | 1.00 | 0.14 | −0.14 | 1.14 | 1.26 |
| exampe 2      0.00 | 1.00 | 0.79 | −0.79 | 1.14 | 1.26 |

| OUTPUT | | | | | |
|---|---|---|---|---|---|
| Measured positions | | Measured pitches | | Calculated error | |
| Xa um | Xb um | pitch A um | pitch B um | X0 nm | Y0_selfref nm |
| example 1    6.93 | −6.93 | 8.00 | 8.80 | 0.85 | 0.50 |
| exampe 2      1.00 | −1.00 | 1.62 | 1.78 | 0.85 | 0.66 |

For some illustrative examples Table 1 is calculated for a self-referencing sensor. The first example of the input and output table corresponds to a native 7th order pitch (at detection level) which when set oblique gets detected as a native first order signal (see measured pitches). The by leverage reduced noise is getting close to the interferometer noise in a non-scanning direction (assuming reproduction noise in x=1.2 nm and tentatively setting interferometer noise in the non-scanning direction at 0.5 nm).

The second row corresponds to the same mark grid at an angle of 45 degrees (0.79 rad). In that case the lower noise level in Y0_selfref with respect to X0 is from the factor 2 due to the self referencing principle (see equation 8).

FIG. 5 schematically depicts a scan result along the central Y=0 position along the x-direction, showing the interference of the two gratings. One step is 300 nm.

Capture

Capture for alignment mark AM as described above can be performed by using an additional alignment mark AM2 in the scribe lane for which holds: Pitch A2=Pitch B1, Pitch B2=Pitch A1, β2=−α1, and α2=−β1. The number 1 here refers to alignment mark AM described above.

Because of the shift of alignment position due to an offset in Y, the gratings A1 and A2 together with B1 and B2 give the captured position in X and Y. Note however that the number of zigzag scans to find alignment mark AM in the non-scanning direction (i.e. substantially perpendicular to the scanning direction) needs to be increased as compared to a standard alignment mark with the same total width. However no separate scans in X and in Y are required, which saves some scans. The design given in FIG. 6 is expected to give the same number of scans as for a standard X or Y scribe lane mark of the same width. For the examples above, the resulting capture for the first example in the scanning direction would be: measured pitch A1*measured pitch A2=Measured pitch B1*measured pitch B2=88 μm. For the second example, a non practical small capture range is achieved. On top of adding a larger tilt to the grating, known techniques can be applied to increase the capture range (use AH variants or use of a lower native order).

Mark Design

The concept has been explained above based on a mark design allowing for use with a self referencing sensor. Other solutions are to use the two grids A and B printed into each other (see FIG. 6). This design has better overlap for the different self referencing grids and may have better capture properties than the mark of FIG. 2.

FIG. 6 shows an alternative design, allowing better overlap for any Yoff position and less position dependent structure variations within the sensor. So, according to an embodiment, there is provided an alignment mark, wherein the first area and the second area substantially overlap.

When the different pitches of the grids of FIG. 2 give overlap (due to Yoff) this can be beneficial to derive from these signals a value for the level of overlap (and thus additional info for the offset Yoff). The overlap may also result in disturbing signals, which can be minimized by allowing for a gap of, e.g., 1 μm of no signal generating mark structure. This is shown in more detail in FIG. 7, showing an alternative design, which prevents potential disturbing signals when grating type A overlaps type B at a large Yoff value. This structure may therefore possibly be better for accurate, fine wafer alignment. So, according to an embodiment, the first area is separated from both the second and third areas by a gap.

FIG. 8 schematically shows a combination of four scribe lane alignment mark segments which can capture X-Y and fine align X and Y. This will give the highest intensity signals, and may provide better reproduction. To reduce scribelane usage, the segments can be positioned next to each other. In that case, at the interface of two segments of same grid and at opposite angles, capture information can be deduced from the mirror symmetry of the signal trace at the exact crossing point between the two segments. Two of such segments alone can provide fine-alignment information.

So, according to an embodiment, an alignment mark is provided, including a periodic structure formed by mark lines, the alignment mark being formed in a scribe lane of a substrate, the scribe lane extending in a scribe lane direction, the alignment mark including:

a first area including a first periodic structure formed by first mark lines extending in a first direction, the first direction being at a first angle α with respect to the scribe lane direction: 0°<α<90° and a second area including a second periodic structure formed by second mark lines extending in a second direction, the second direction being at a second angle β with respect to the scribe lane direction: −90°<β<0°, wherein the alignment mark further includes a third area including a third periodic structure formed by third mark lines extending in the first direction and a fourth area including a fourth periodic structure formed by fourth mark lines extending in the second direction. The third and fourth areas may be included for optional purposes. The third and fourth areas may have the second and first period respectively. According to an embodiment provided below −90°≦β<0°.

The first angle α may be substantially equal to minus the second angle β: α=−β. The first periodic structure may have a first period and the second periodic structure may have a second period, the first period differing from the second period.

Another possibility is to use four scribe lane alignment marks as shown in FIG. 8. In that case, the signals will be less complex for analysis and can separately be dealt with by the software. Including capture this would generally involve four alignment marks.

For alignment sensors including reference gratings (such as diffraction alignment sensors or through the lens sensors) the two grating periods of a scribe lane can be chosen at an arbitrary location and do not need to fulfill the self referencing principle as for a self-referencing sensor.

Remarks

The above mentioned embodiments provide XY detection from a single scribe lane mark. Also, it results in a better reproduction. Since only one scribe lane area is needed for X and Y alignment, real estate is saved on the substrate. Furthermore, optimal alignment (XY) for intrafield exposure correction is achieved.

The oblique direction of the grating causes that the orders pass through the sensor at a different azimuthal angle as the standard X-Y directions. This may require additional calibrations.

Although a higher native order is on the wafer (seven in the examples), detection takes place at a larger pitch (lower frequency). Thus 1/f noise contribution is larger at smaller angles of the grating than for pure higher order detection at orthogonal orientation of the grating with respect to scanning direction (at α=90 degrees).

The examples given are only illustrative. Other combinations with larger capture areas or optimized orders can easily be conceived.

Coarse and fine alignment interpretation becomes more complex since X and Y information is mixed.

The embodiments described above may be used with any suitable alignment sensor.

The embodiments can be simply implemented in systems using self-referencing alignment sensors. For through-the-lens alignment sensors, a different mask set may be required. For use in combination with a diffraction alignment sensor, additionally a different hardware sensor may be required.

Summarizing the above, the principle of the oblique alignment mark as presented above is that a scan along the length of the alignment mark results in two superposed modulated signals. The positions of these two periodic signals determine X and Y. The average of both grid positions (in the scribe lane direction) gives the position of the mark in the scanning/scribe lane direction. The difference between the position of both grid positions (in the scribe lane direction and amplified by the slope of angle α) gives the Y position.

An additional attractive property of this mark is that the angle can be used to lower reproduction numbers below those of a standard mark. Direction dependent interferometer/grid plate noise can lead to optimum mark design in which the angle of the grid determines the strongest noise contributor in the final aligned position.

Exemplary Embodiment 2

As described above, existing alignment marks and methods have certain disadvantages.

Existing scribe lane marks can only be used for one alignment direction (X or Y). Also, each alignment direction (X and Y) has a fine alignment section and an additional course/capture section (e.g. 17.6 μm segment).

For every coarse alignment in the scanning direction at least 2 segments need to be scanned.

For instance, to capture a 38 μm alignment mark (X or Y) with a self-referencing alignment sensor the bare minimum number of scans is three. The currently recommended number of scans is higher, for instance six or twelve.

Current tendencies are:
Total wafer exposure time is decreasing;
More refined wafer alignment strategies (e.g. by grid mapper, zone alignment, refined intrafield alignment corrections) for optimized metrology modeling;
Better overlay;
More types of test structures in scribe lane;
Reduced scribe lane width (80 to 40 μm); and
Better and more flexible alignment capabilities:
 compare self-referencing sensor to diffraction alignment sensor, and
 vision is getting more refined.
The above results in the following challenges:
More alignment marks on the substrate:
 To create locally a finer grid (at strong gradients);
The need to enable more potential mark placement area;
Less space available in the scribe lane;
Less time for full wafer alignment;
Greater number of alignments for full wafer alignment;
More robust capture/coarse alignment then WGA marks and no more operator intervention; and
Better reproduction and RPN (RPN being the Residual Process Noise).
These challenges can be met by at least fulfilling one of the following conditions:
Small XY mark surface area;
Lesser number of scans per XY position information;
X and Y info also from, respectively, Y and X scribe lane; and
A change in mark layout (for better reproduction).
This asks for a different design than existing mark types and other signal handling.

Examples

According to an example a single alignment mark AM is described as shown and described above with reference to FIG. 2. In an example, alignment mark AM has a width of about 39 μm (substantially perpendicular to the scribe lane direction) and a length of about 80 μm, thus having an area of approximately 3100 μm2. This alignment mark AM allows
X-Y Capture capability ±44 μm; and
X-Y Fine scan capability All this information (XY coarse and fine) is obtained by three scans only: two for capture/coarse in a non-scribe lane direction and one for capture/coarse and fine align in a scribe lane direction. A need for only two scans can be realized when only one capture scan is used if the capture range needs to be smaller (e.g. ±20 µm) or alignment mark AM is longer (e.g. has a length of 132 µm).

Below it will be explained how to use this oblique alignment mark AM for capture/coarse to an accuracy <±0.5 um.

In particular embodiment, both grating periods constituting the oblique alignment mark result in similar signal strength as detected by the sensor. For a 40 µm scribe lane aligned by a 36 µm wide beam, a particularly useful dimension for 3 segments is approximately 13 µm for an approximately 39 µm wide mark.

To determine the position of the alignment mark when a substrate is loaded for the first time, the following sequence is followed in case the alignment mark is along the X-scribe lane. In this sequence it is explained how the detection of the coarse mark location works.

Capture/Coarse Along Non-Scribelane Direction

Two scans each of approximately 130 µm in the non-scribe lane (Y) direction over the alignment mark to cover a total full capture range of ±44 µm. For this, particularly useful positions to start the scans are (±20,−65) or (±20,+65) um. The self-referencing sensor signal obtained will look like the signal of FIG. 9a. FIG. 9a shows a mark shape (left) located in X-scribe lane and a signal trace (right) when scanning in non-scribe lane direction (Y: top down) over the alignment mark.

A scan in non-scribe lane direction (Y) over the mark of FIG. 9a gives two periodic signals proportional with:

The pitch of segment A/C, and
The pitch of segment B.

In this case the design of the alignment mark in FIG. 9a is such that segment B gives along the scribe lane direction (X in this case) a signal corresponding to that of an AA5 segment (signal period 1.6 µm). The tangent of the grid is ¾ and thus the detected signal of segment B along Y axis is 1.6*¾=1.2 µm. The A/C segments correspond to an AA4 segment (2 µm signal) in X-direction and thus the detected pitch in Y is 1.5 um. AA4 and AA5 are known alignment mark designs.

The signal contour on the right hand side of FIG. 9a includes 3 parts. The first (1) and last part (3) are similar and consist of one frequency component in an envelope. Part 1 is due to interference of zone C with its self-referenced image. Part 3 is from self interference of part A. Maximum modulation (in the centers of parts 1 and 3) is obtained when there is full overlap between the mark zone with its self-referenced image. Part 2 is the superposition of: A with the self-referenced image of C, C with the self-referenced image of A and B self-referenced with itself. Since B has a different period than A and C one can see the superposition of two modulation frequencies.

When the Y-scan is performed at different X positions the phase of the periodic signals changes (see FIG. 10 for 7 scans separated by 200 nm). Around the mark center the two periods clearly interfere. To determine the center of the mark, i.e. the centre of zone B, the following two methods can be performed.

FIG. 10 shows 7 scans at different lateral positions (shifted by 200 nm) each having a different phase depending on the x position along the scanning direction. The left side of the figure shows an overall signal, the right side of the figure shows a detail around position=0.

Exemplary Method 1

According to a first exemplary method, the following actions are performed:

1) Put a band pass filter (e.g., Finite Impulse Response, FIR type to avoid phase changes) over the signal at the expected modulation (1.2 µm) of center zone B. This results in FIG. 12. This reduces the impact of signal due to product structure and results in a single modulation signal. FIG. 11 shows that the measured signal passes a FIR bandpass filter. The resulting trace in the center is shown in more detail at the right hand side.

2) For each location (i) the absolute value is taken of the mirrored signal trace subtracted from the signal trace:

$$S_m(i) = \sum_{j=-n_m}^{j=n_m} ABS\{S(i+j) - S(i-j)\} \quad (16)$$

where:
S(i) is the signal at position i;
nm is the summation range of original minus mirrored signal trace.

An optimal value for nm depends on the mark shape. It is in the line of expectation that this optimal value is independent of sensor (if from the same type) and process. FIG. 9b shows an illustration on the working of this operator on a signal trace. FIG. 9b depicts an illustration of the operation of equation 16: The top trace is a sketch of the aligned signal. Below the mirrored trace is shown and the lowest row gives the absolute difference between both traces. The summation (integration) over this curve over 2*nm positions for each position i results for the center of the curve (at which location the center of the mark is located) to a minimum.

3) This is followed by subtracting the signal at a fixed distance from each other. This fixed distance may be a multiple of the detection period.

$$S_{dm}(i) = ABS\{S_m(i+n_d) - S_m(i-n_d)\} \quad (17)$$

where 2*$n_d$ corresponds with the number of sampling points within the period of the delay. An optimal value for $n_d$ depends on the period and shape of the mark. It is in the line of expectation that this optimal value is independent of sensor (if from the same type) and process. FIG. 9c shows an illustration on the working of this operator on a signal trace. The trace finds a minimum at the center of the mark in this operation. The dotted line gives the integrated signal over at least one period.

4) Next, an integration over some period is performed to average the results.

5) This results in a minimum which is independent of the X position at which the scan was performed (see FIG. 12). FIG. 12 shows that the trace is rather independent of the X-position of the scan. Even adding noise of equal magnitude as the amplitude of the mark does not significantly affect the minimum position.

6) The minimum position can be determined by way of a fit to a quadratic curve (not shown here).

Exemplary Method 2

An exemplary method 2 is provided for capture in non-scribe lane direction. Method 2 may include the following actions:

1) Filter for the outer segments (¾*AA4 grid). This gives the signal as presented in FIG. 13. FIG. 13 shows an AA4 filtered signal resulting in three structures.

2) Determine the positions of maximum amplitude of these signals (dots in FIG. 14).

3) Fit these positions to the expected structure (line in FIG. 14) in a way which is similar to the template fit procedure (already used for, among others, WGA marks within self referencing sensor techniques). FIG. 14 shows a measured maxima expected signal.

4) The center of the mark is now easily found: the centre of the middle peak. As for Method 1, this method is independent of the x position.

Capture/coarse Along Scribelane Direction

A scan is performed of about 130 µm in scribe lane (X) direction over the mark. The scan may include the edges (at −X and +X) and cover a total full capture range of ±44 µm. An example of the self-referencing signal that may be obtained is shown in FIG. 15. The same physical scan may later on, after capture/coarse alignment also be used for fine alignment.

FIG. 15 depicts a single scan signal. A period of 8 µm which is a combination of the (1.6 and 2 µm) pitches can clearly be seen.

The scan gives 1.6 µm and 2 µm periods which interfere to result in a 8 µm periodic signal.

A scan can take place at any position within Y=±0.5 µm from the center. In FIG. 16, the signal traces are shown when the scans are distributed over non-scanning direction. Similar as to Method 1 described above, the following actions can be taken to find the center of the mark with an accuracy of better than about 0.5 µm:

1) Filter for either period (see FIG. 17).

2) Perform the mirror action, the delay action and integrate. A good choice for the delay is about 40 or 48 µm for a mark length of about 80 µm and a spot size of about 36 µm. This ensures that the range at which the difference signal has perfect overlap is short which results in a sharper dip of the signal at the centre of mark position.

3) This results in FIG. 18. The found center position in x-direction is independent of the y-offset. Introduction of scan-asymmetric noise does not noticeably affect the centre position.

Figure 1:
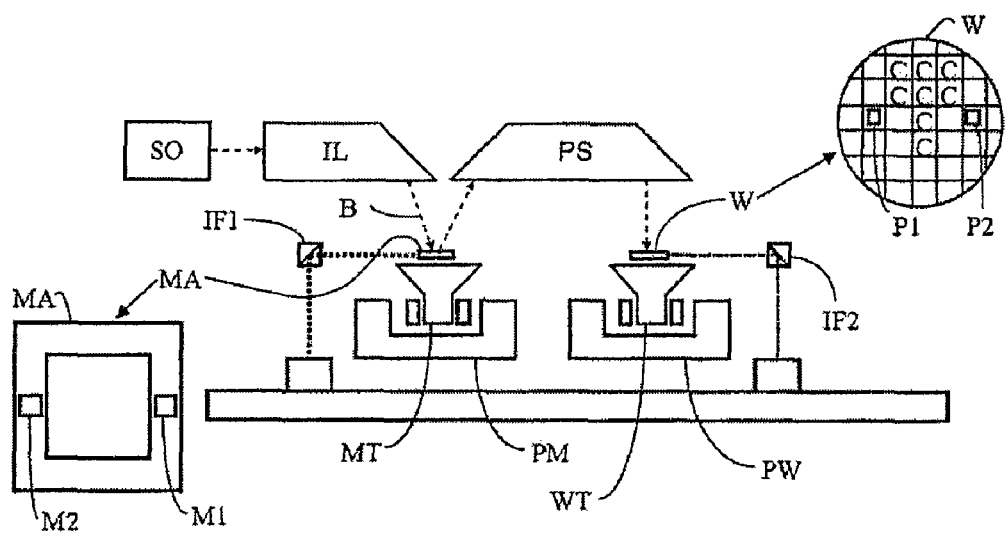

The above provides a method, wherein before performing a fine alignment scan of the alignment mark in a direction substantially parallel to the scribe lane direction using a self-referencing alignment sensor, resulting in a fine alignment signal including a first and a second superimposed periodic fine alignment sub-signals, which is described in more detail below, at least one capture alignment scan of the alignment mark is performed.

According to an embodiment, the at least one capture alignment scan includes performing a scan of the alignment mark in a direction substantially perpendicular to the scribe lane direction using the self-referencing alignment sensor, resulting in a first capture alignment signal including a respective first, second and third part, where the first part is associated with the first and third periodic structure, the second part is associated with the first, second and third periodic structure and the third part is associated with the first and third periodic structure.

According to an embodiment, the method includes filtering out the first and third part resulting in a filtered capture alignment signal and performing a mirror action, a delay action and an integration action on the filtered capture alignment signal to compute a capture alignment position in a direction substantially perpendicular to the scribe lane direction.

According to an embodiment, the method includes filtering out the second part resulting in a filtered capture alignment signal and performing a mirror action, a delay action and an integration action on the filtered capture alignment signal to compute a capture alignment position in a direction substantially perpendicular to the scribe lane direction.

According to an embodiment, the at least one capture alignment scan includes performing a scan of the alignment mark in a direction substantially parallel to the scribe lane direction using the self-referencing alignment sensor, resulting in a second capture alignment signal including a first and a second superimposed periodic capture alignment sub-signal.

According to an embodiment, the method includes filtering out the first or second superimposed periodic capture alignment sub-signals resulting in a second filtered capture alignment signal and performing a mirror action, a delay action and an integration action on the second filtered capture alignment signal to compute a capture alignment position in a direction substantially parallel to the scribe lane direction.

According to an embodiment, the fine alignment scan is the same as the capture alignment scan in the direction substantially parallel to the scribe lane direction and the second capture alignment signal is the same as the a fine alignment signal.

According to an embodiment, the at least one capture alignment scan in the direction substantially parallel to the scribe lane is performed at the first capture alignment position in a direction substantially perpendicular to the scribe lane direction.

Fine Along Scribelane Direction

Once the alignment mark is captured, the fine align signal for X and Y can be determined from the same physical scan as performed for the coarse alignment along the scribe lane. The determination of both X and Y information is above.

Calibration

Calibrations for any remaining offset (because of crosstalk with scribe lane/product structure) of the capture/coarse scans can be by fine align scans. The fine aligns need to calibrated to the transmissive image sensor similar as current marks.

Qualifiers

For the fine align phase and WQ the same qualifiers as for current alignment scans can be made. For the Capture/coarse scans a new type of qualifier needs to be set for MCC (the multiple correlation coefficient calculated by fitting a template to the raw signal; by calculating the MCC for templates at different positions an MCC curve is obtained). However this can be made to resemble a current MCC definition, for example, correlation of the transformed measured signal to the quadratic fit curve. A correlation of 100% indicates a curve which exactly corresponds to the simulated curve.

According to a further embodiment, there is provided an alignment mark including a periodic structure formed by mark lines, the alignment mark being formed in a scribe lane of a substrate, the scribe lane extending in a scribe lane direction, the alignment mark including:

a first area including a first periodic structure formed by first mark lines extending in a first direction, the first direction being at a first angle α with respect to the scribe lane direction: 0°<α<90° and a second area including a second periodic structure formed by second mark lines extending in a second direction, the second direction being at a second angle β with respect to the scribe lane direction, wherein the first angle α substantially differs from the second angle β and the second angle β is substantially equal to −90°. It is noted that the above embodiments and formulae also work for a situation in which the second area includes lines substantially perpendicular to the scribe lane direction. Such an embodiment also allows using the second area in combination with positioning techniques that are not suited for use with oblique mark lines.

Further Exemplary Embodiment

An alignment mark is provided that is sub-segmented and overcomes the drawbacks of existing alignment marks.

According to an aspect, there is provided an alignment mark AM, including a periodic structure formed by mark lines, the mark being formed in a scribe lane of a substrate, the scribe lane extending in a scribe lane direction, the mark including:

a first area including a first periodic structure formed by first mark lines extending in a first direction, the first direction being at a first angle α with respect to the scribe lane direction: 0<α<90 and a second area including a second periodic structure formed by second mark lines extending in a second direction, the second direction being at a second angle β with respect to the scribe lane direction: −90<β<0, the first mark lines having a first period and the second mark lines having a second period, the first period being resolved along a scan direction being identical to the second period being resolved along the scan direction, a line end of each first mark line abutting a line end of an adjacent second line mark.

According to a further embodiment, β may be substantially equal to −90°.

By contacting the line end of a first mark line with a second mark line, the adverse influence on the line ends by the processing to define the mark lines (i.e. etching the mark lines) is strongly reduced. The line ends are more precisely defined which improves the accuracy of the measured position of the alignment mark.

Additionally, connection of the first and second line ends reduces the tendency of narrow sub-segmentation lines to tumble over and cause contamination.

Figure 19:
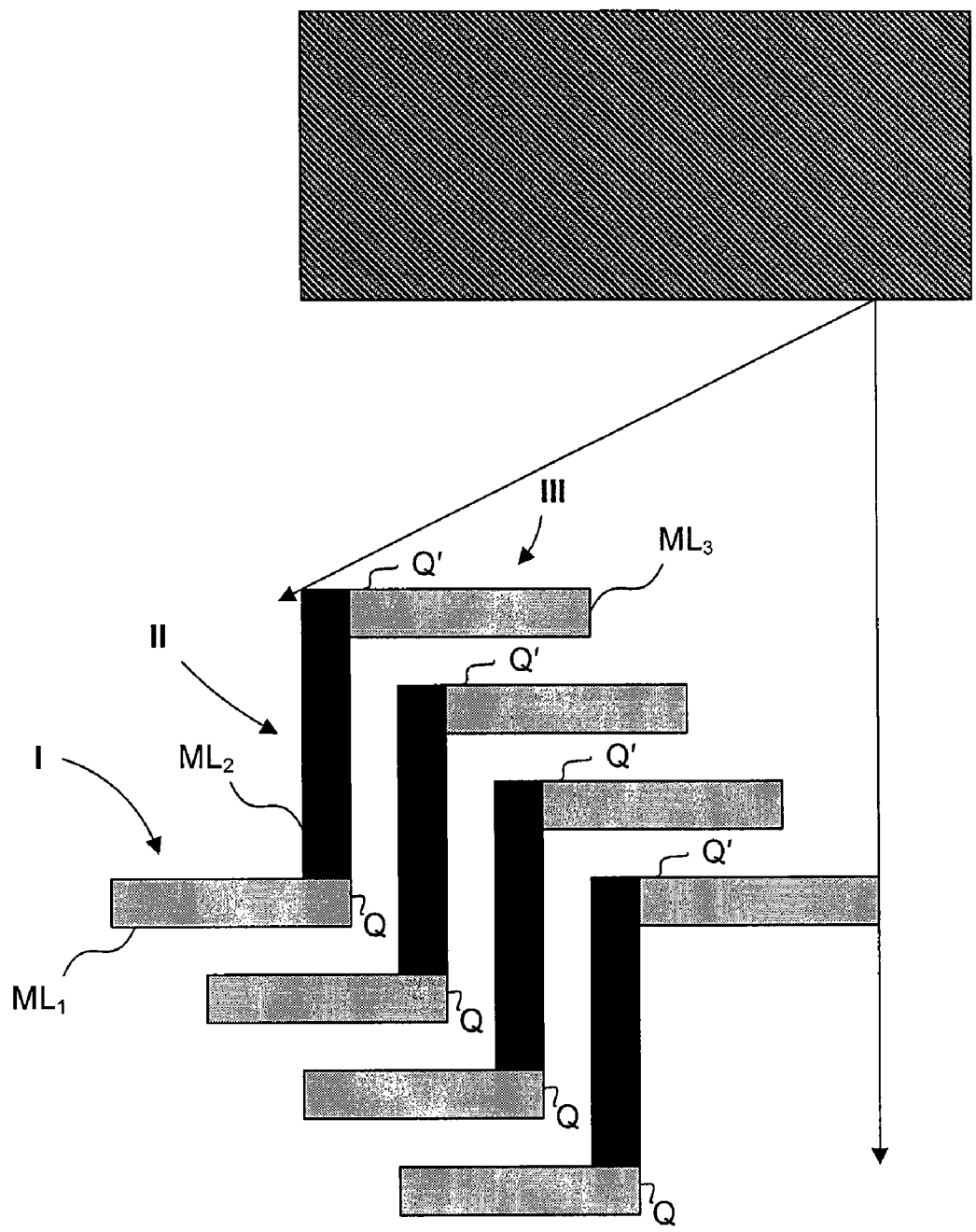

FIG. 19 depicts a layout of a subsegmented (unresolved) bidirectional alignment mark according to an embodiment of the invention.

Alignment mark AM includes a periodic structure of a first area I including a first periodic structure formed by first mark lines ML1 extending in a first direction, the first direction being at a first angle α with respect to the scribe lane direction: 0°<α<90°, a second area II including a second periodic structure formed by second mark lines ML2 extending in a second direction, the second direction being at a second angle β with respect to the scribe lane direction: −90°≦β<0°, and a third area III including a third periodic structure formed by third mark lines ML3 extending in the first direction, the third periodic structure being similar to the first periodic structure.

Thus, with regard to the orientation and the period of the third periodic structure, the third mark lines ML3 are substantially identical to the first mark lines ML1.

In this embodiment, the first mark lines ML1 have a first period and the second mark lines ML2 have a second period. The first period is substantially identical to the second period.

Furthermore, a position Q of a line end of each first mark line coincides with a same position of a line end of an adjacent second mark line.

Also, a position Q' of a line end of each third mark line coincides with a same position of a line end of an adjacent second mark line.

In this manner, the line end of the first mark line ML1 connects to or abuts the line end of the adjacent second mark line ML2. As a result, each first mark line, adjacent second mark line, and third mark line form a concatenated line.

Due to the line end of the first mark line being coincident with the line end of the second mark line, and the line end of the second mark line with the line end of the third mark line, the inaccuracy of the position of each individual line end is reduced. As a result, the accuracy of the scanning measurement of the alignment mark is improved.

Also, by connecting the line ends of first and second mark lines and of second and third mark lines, the tendency of relatively long and narrow mark lines to tumble over can be significantly reduced.

Remarks

The above embodiments may include a number of features with respect to the alignment mark and the special data handling, such as:

to obtain the same amount of information, the total mark area on the substrate may be reduced by a factor of 10-20;

a number of scans may be reduced by a factor of 5-15;

a more robust COWA (coarse wafer alignment) (since it is based on periodic structures) and no operator intervention;

an relatively good reproduction compared to certain current mark designs (when strongly sloped oblique marks are employed);

better field alignment coverage than some existing systems (i.e. fine Y mark info from an X-scribe lane) for e.g. intrafield exposure correction.

A useful result of the special data handling on other periodic marks is that COWA for a single scribe lane segment with higher order segmentation is possible in the direction of the scribe lane (not both X and Y info). In case periodic structures are also present in the non-scribe lane direction (e.g. GUM marks) then by the proposed data handling X-Y COWA can be performed.

Further Remarks

The number of scans decreases with the narrow alignment mark; however, for coarse wafer alignment the length and thus the duration of the scan will increase. Calculating the pure scan time (excluding preparation and fly-in) takes, for a current single COWA segment, 16 μm/(0.150 μm*20 kHz)= 5.5 ms. This now changes to 130 μm/(0.150 μm*20 kHz)=45 ms. However the minimal time to prepare (fly in and settle) a current scan takes minimally 30 ms and in practice when 24 scans (for COWA of a single direction mark) are performed it takes even 50 ms per scan (1.2 seconds in total). Thus a longer scanning time may not lead to a proportionally longer time to obtain the aligned position.

With a single alignment direction as provided by oblique marks the stage does not need to change its direction as is the case with separate X and Y marks, and hence does not need to perform speed limiting (de-)acceleration actions.

The calculation time per scan is due to the additional operations expected to increase. Therefore to make use of the opportunities delivered by the oblique marks, additional calculation power should be present on the machine. A new board can solve this drawback.

The signal strength of an oblique alignment mark is better than AH type marks but less than AA marks. It means that the minimal mark depth which can be measured by an oblique mark is 50% larger as that for an AA mark (AA marks is a group of known marks such as the AA4, AA5 and AA7 mark).

To expose these oblique marks it may be helpful to sub-segment the mark. This is in line with the current trend for alignment marks to be subsegmented as a product.

Rotation and magnification of the wafer/mark will in first order not affect the aligned position, neither coarse nor fine, because of the self referencing (rotation 180°) character of the signal handling.

Figure 2:
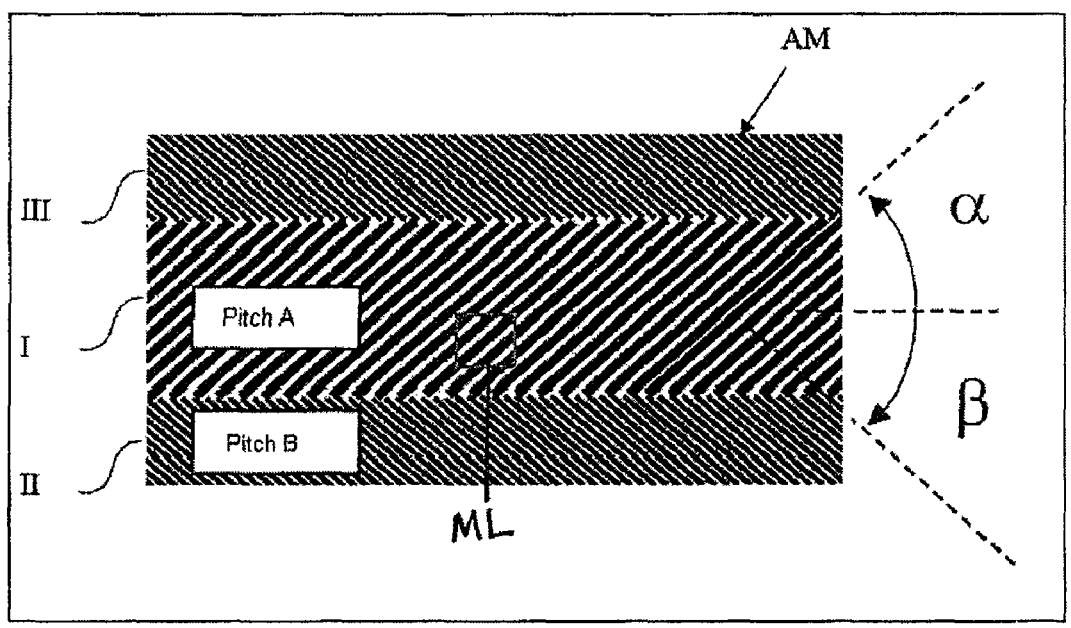
Figure 3:
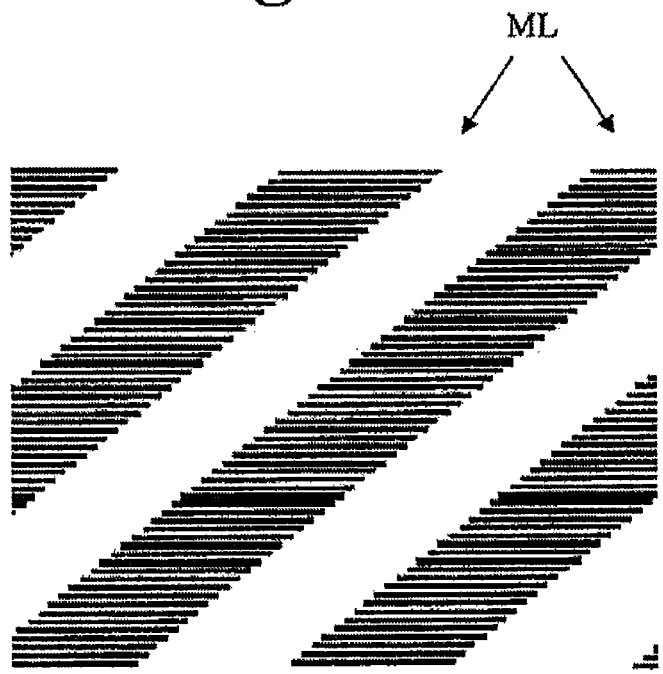
Figures 4A, 4B:
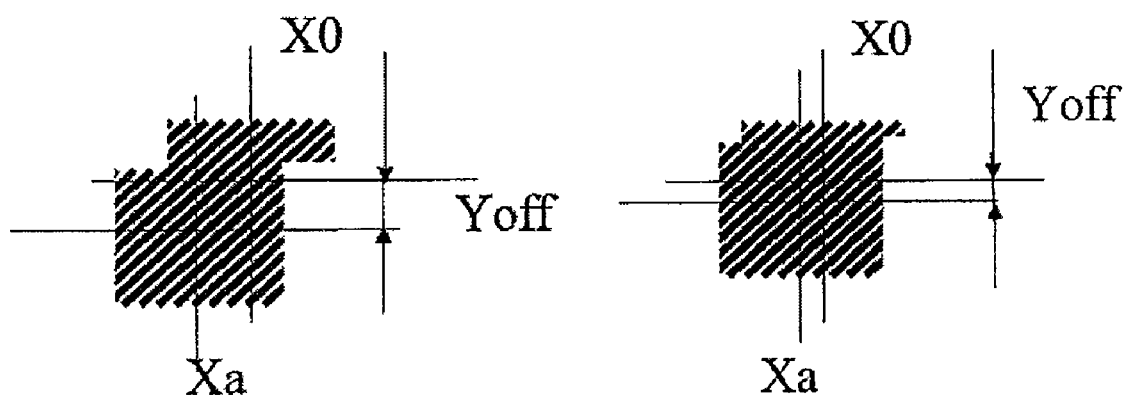
Figure 5:
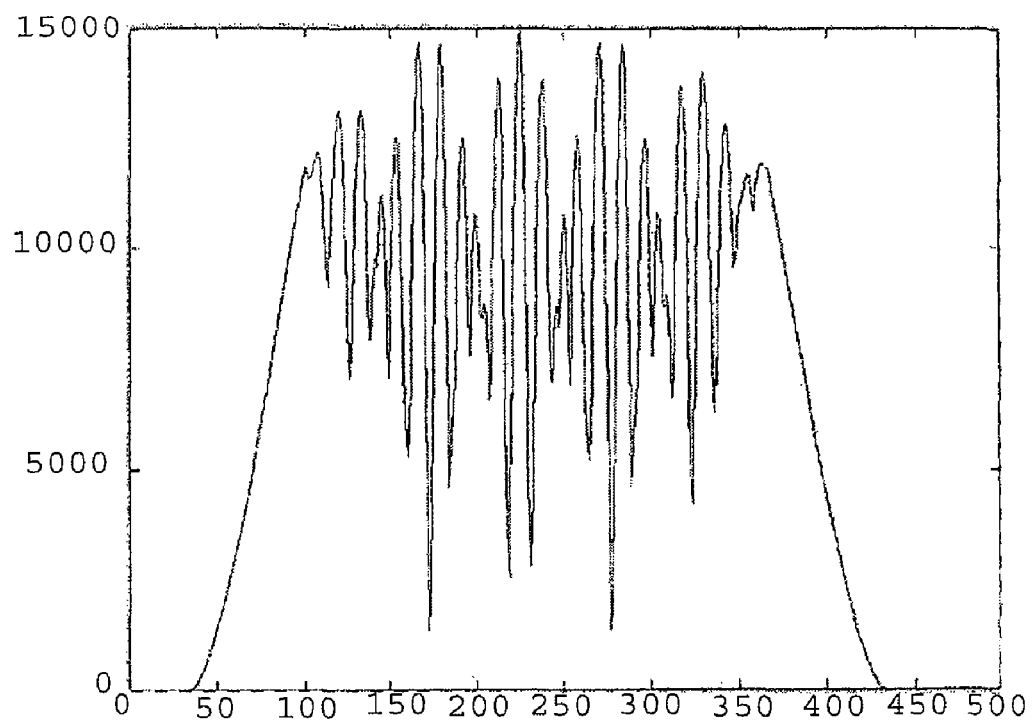
Figure 6:
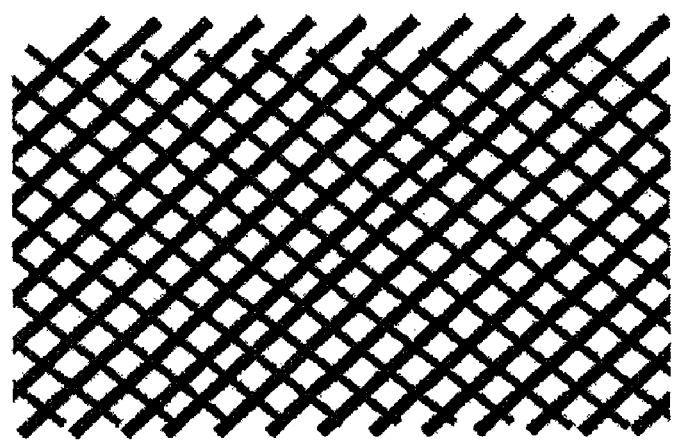
Figure 7:
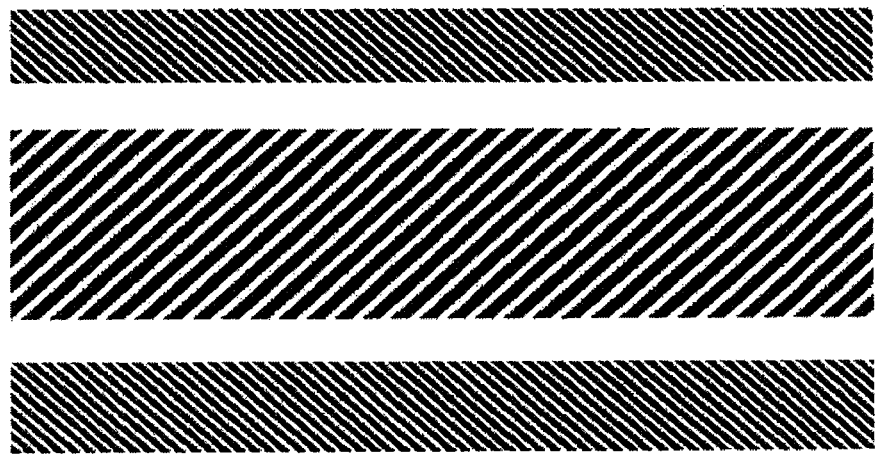
Figure 8:
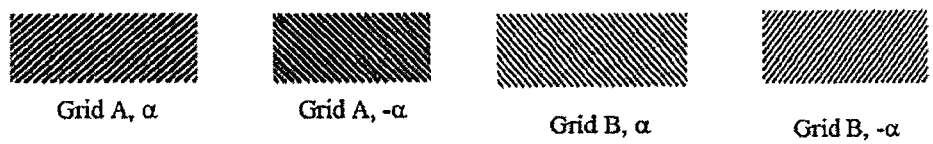
Figure 9A:
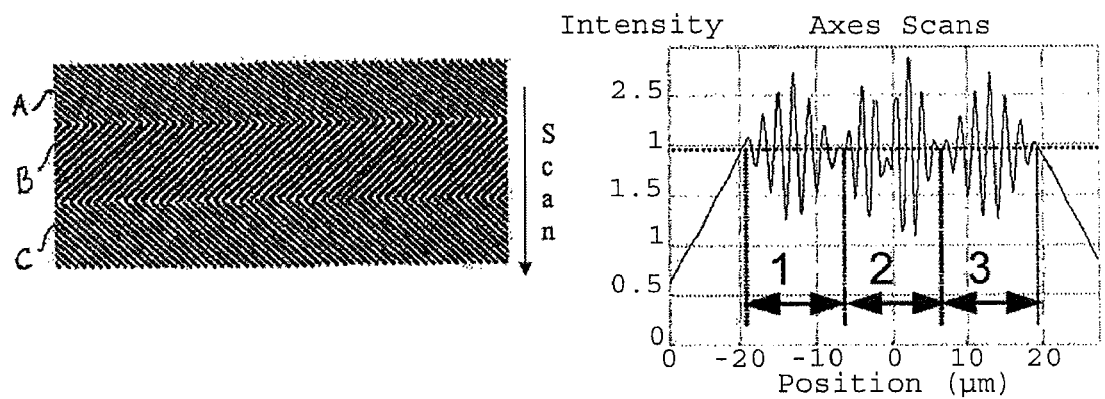
Figure 9B:
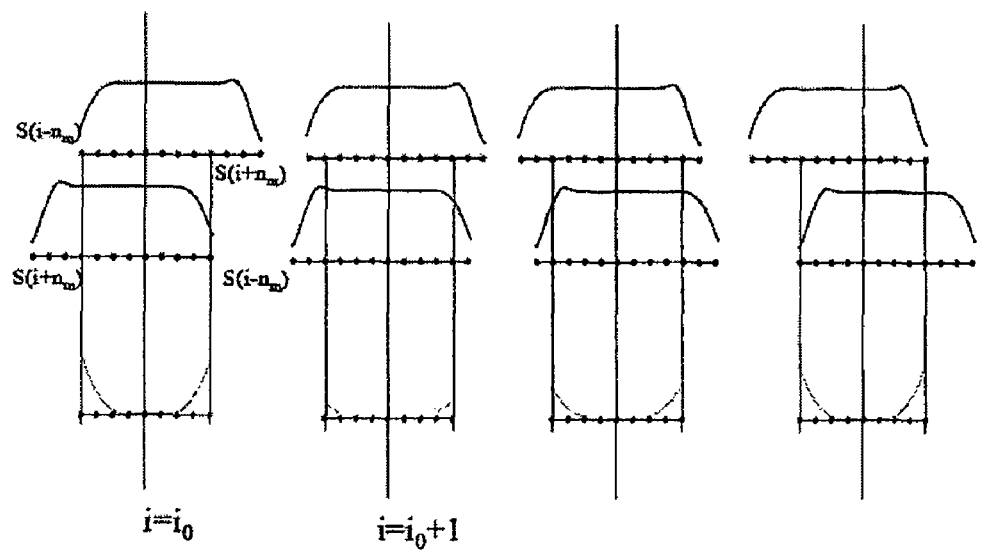
Figure 9C:
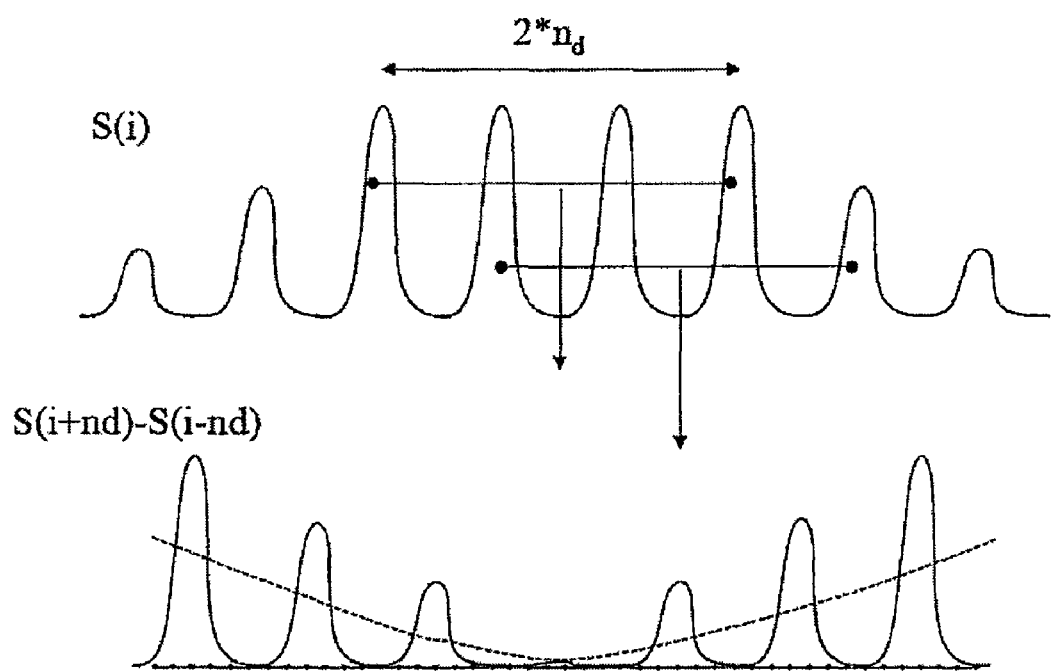
Figure 10:
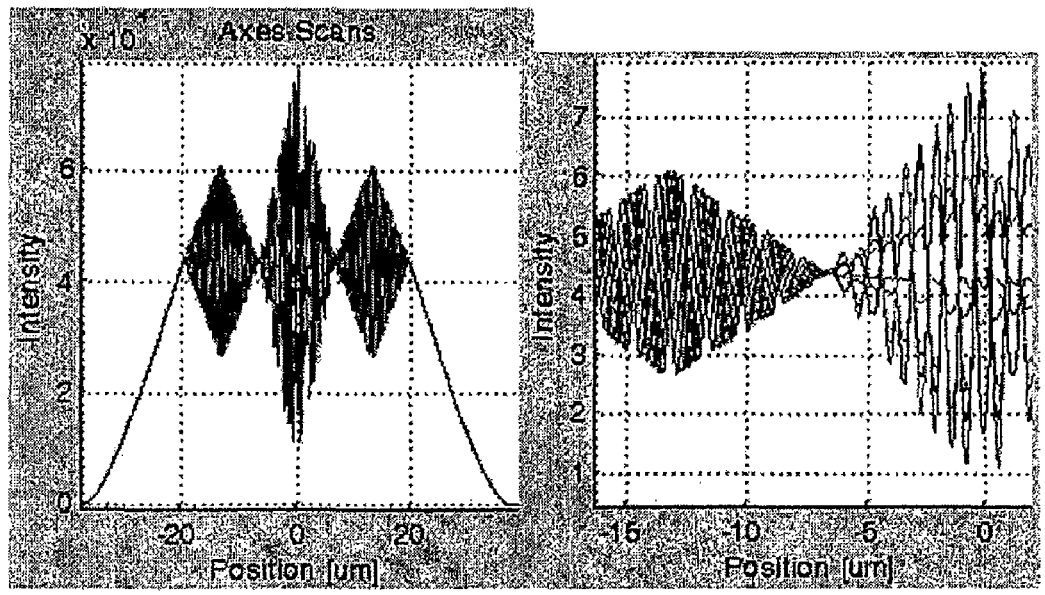
Figure 11:
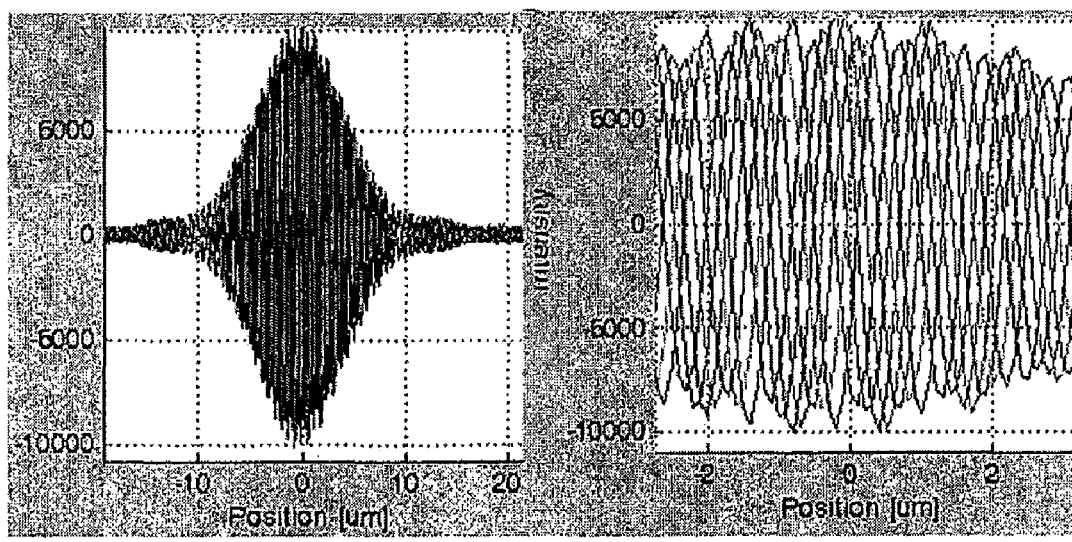
Figure 12:
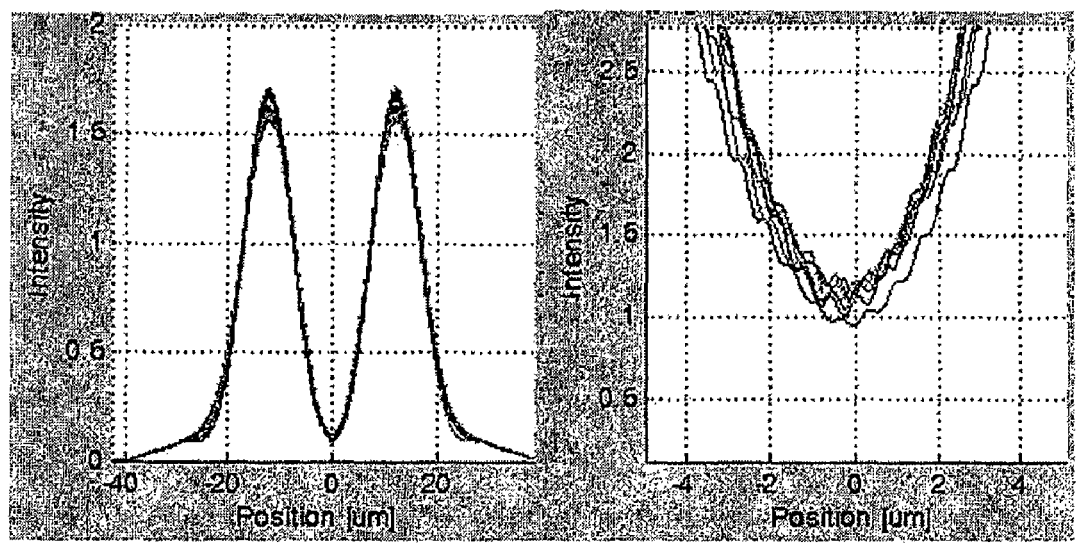
Figure 13:
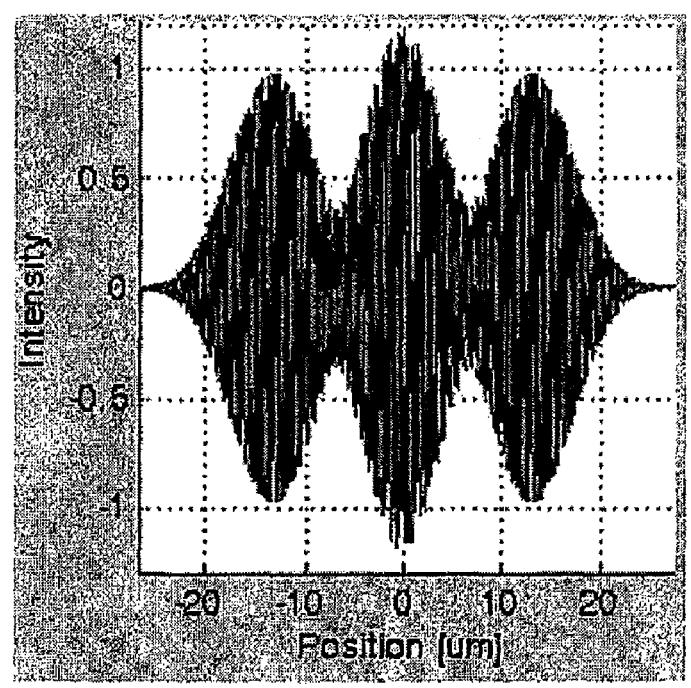
Figure 14:
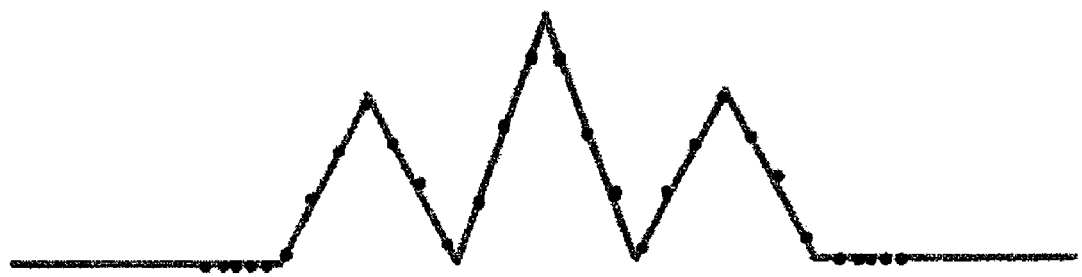
Figure 15:
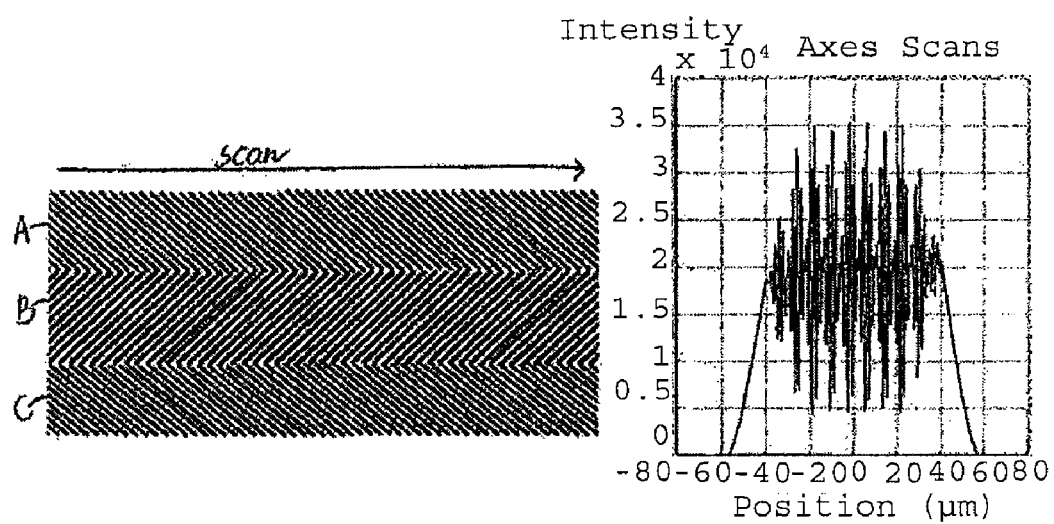
Figure 16:
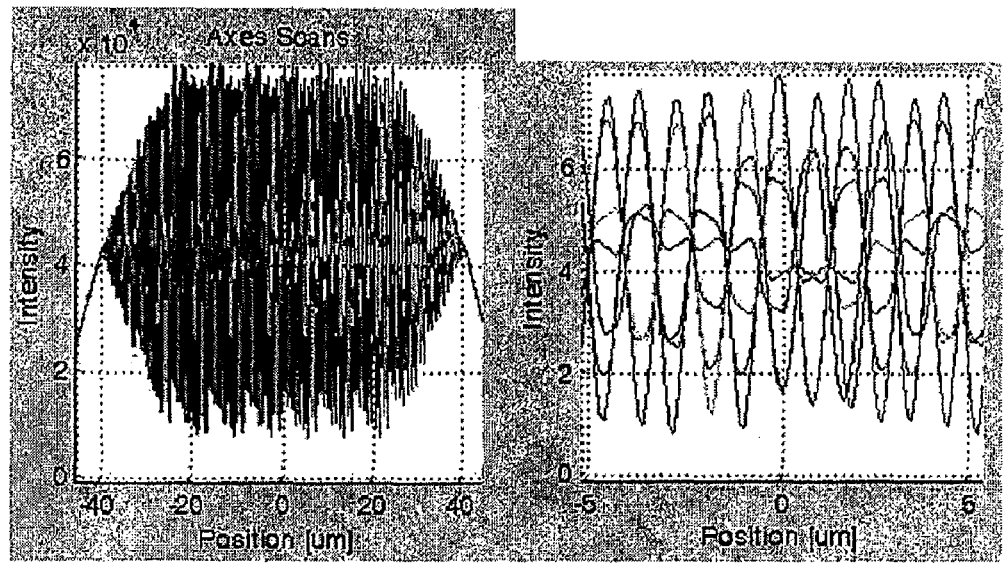
FIG. 16 shows a signal trace having superposed AA4 and AA5 signals (left overall signal, right detail around position=0). 7 scans with different offset in the (non-scanning) y direction are represented over a distance of ±0.6 µm (7 scans, step 0.2 µm).
Figure 17:
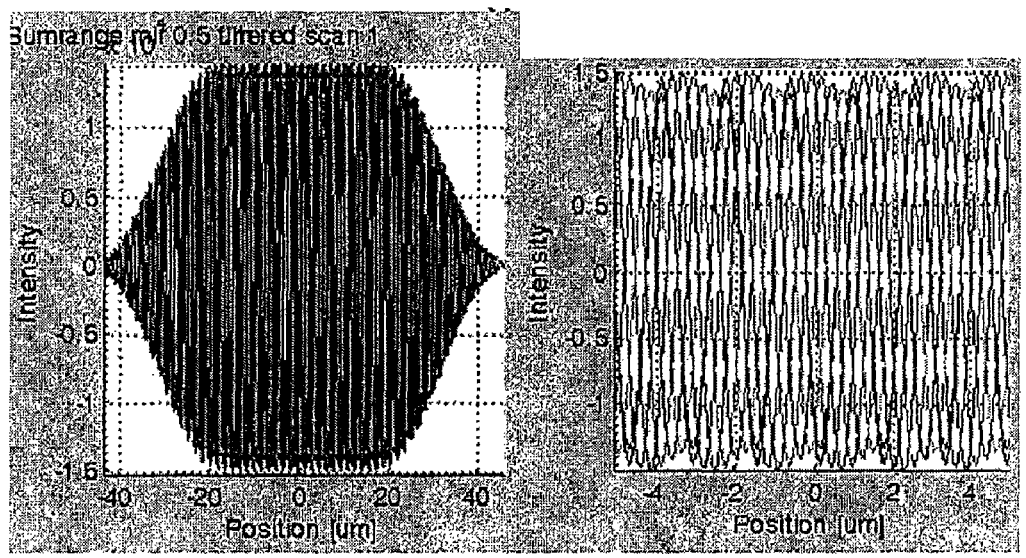
FIG. 17 shows a filtered scan result. A pass band filter around 1.6 µm period results in a sinusoidal signal traces.
Figure 18:
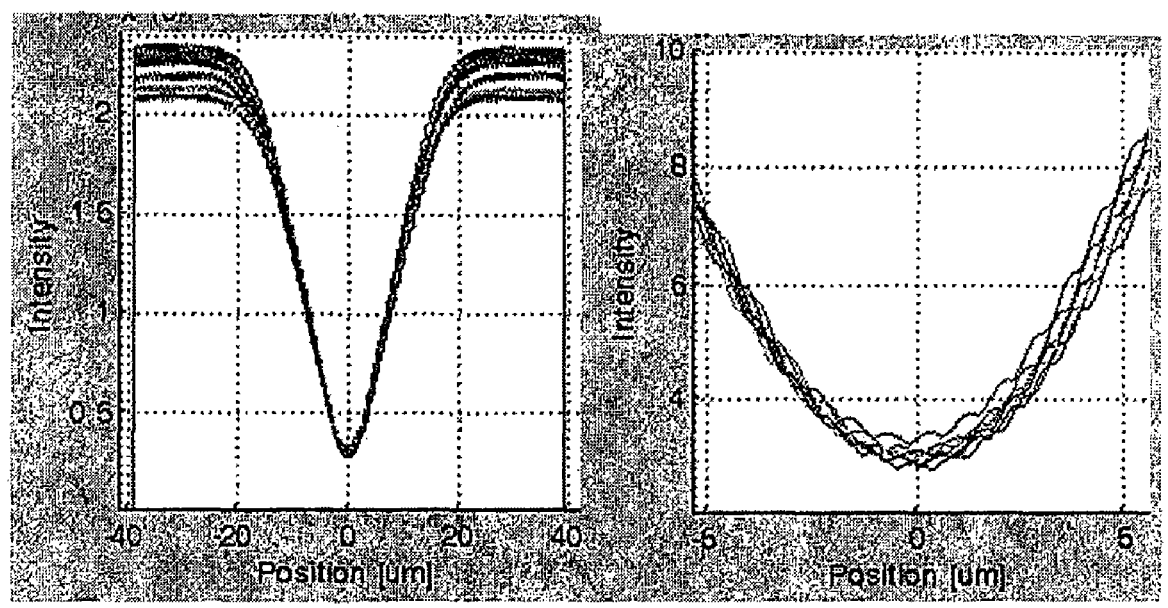
FIG. 18 shows that by subtracting the mirrored signal trace at each position and subtracting the signal delayed by about 48 µm the center of the mark is easily found at the capture range of ±0.5 um (±0.5 µm capture range is useful for interpretation of the accurate, fine wafer alignment result from the same scan).

The alignment structure as shown in FIG. 2 has inversion symmetry (180° rotation) which allows alignment with the self referencing sensor. Alignment by another sensor (e.g., diffraction alignment sensor, TTL) would tend to involve hardware modifications. The alignment mark as described above can be detected by:
  a modified reticle-reference grating and pupil plane filter, (TTL type),
  dedicated spatial separation (modified diffraction alignment sensor type),
  a vision system or
  self referencing sensor.

Note that current a design diffraction alignment sensor and TTL can detect the mark-type of FIG. 2. However, for this the alignment mark is to be placed at 45° on the substrate which is not desired from a scribe lane direction point of view.

The dedicated data handling method(s) can also be applied to higher order marks. In that case, capture and fine alignment can be performed on a single higher order segment (e.g. AA5 or AA7).

At least parts of the data handling method can also be applied to higher order marks of the diffraction alignment sensor.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An alignment mark comprising a periodic structure formed by mark lines, the alignment mark being formed its a scribe lane of a substrate, the scribe lane extending in a scribe lane direction, the alignment mark comprising:
 a first area comprising a first periodic structure formed by first mark lines extending in a first direction, the first direction being at a first angle α with respect to the scribe lane direction, wherein 0°<α<90°; and
 a second area comprising a second periodic structure formed by second mark lines extending in a second direction, the second direction being at a second angle β with respect to the scribe lane direction, wherein −90°<β<0°;
 wherein the first periodic structure formed by first mark lines touches the second periodic structure formed by second mark lines, and
 wherein the first direction is not perpendicular to the second direction.

2. The alignment mark according to claim 1, wherein the first angle α is substantially equal to minus the second angle β, α=−β.

3. The alignment mark according to claim 1, wherein the first angle α substantially differs from the second angle β and the second angle β is substantially equal to −90°.

4. The alignment mark according to claim 1, wherein −90°<β<0°.

5. The alignment mark according to claim 1, wherein the first area and the second area substantially overlap.

6. The alignment mark according to claim 1, wherein the alignment mark further comprises a third area comprising a third periodic structure, the third periodic structure being similar to the second periodic structure.

7. The alignment mark according to claim 6, wherein the first area is touching both the second and third area.

8. The alignment mark according to claim 1, wherein mark lines are formed by a plurality of sub-segment lines extending parallel or perpendicular with respect to the scribe lane direction.

9. The alignment mark according to claim 1, where mark lines are formed by a plurality of periodic sub-segment lines.

10. The alignment mark according to claim 1, wherein the scribe lane direction is substantially parallel to or perpendicular to the scanning direction.

11. An alignment mark comprising a periodic structure formed by mark lines, the alignment mark being formed in a scribe lane of a substrate, the scribe lane extending in a scribe lane direction, the alignment mark comprising:
 a first area comprising a first periodic structure formed by first mark lines extending in a first direction, the first direction being at a first angle α with respect to the scribe lane direction, wherein 0°<α<90°; and
 a second area comprising a second periodic structure formed by second mark lines extending in a second direction, the second direction being at a second angle β with respect to the scribe lane direction, wherein −90°≦β<0°;
 wherein the first periodic structure has a first period and the second periodic structure has a second period, the first period differing from the second period.

12. The alignment mark according to claim 11, wherein the alignment mark further comprises:
 a third area comprising a third periodic structure formed by third mark lines extending in the first direction; and
 a fourth area comprising a fourth periodic structure formed by fourth mark lines extending in the second direction.

13. The alignment mark according to claim 11, wherein the first angle α is substantially equal to minus the second angle β, α=−β.

14. The alignment mark according to claim 11, wherein the first angle α substantially differs from the second angle β and the second angle β is substantially equal to −90°.

15. The alignment mark according to claim 11, wherein −90°<β<0°.

16. The alignment mark according to claim 11, wherein the first area and the second area substantially overlap.

17. The alignment mark according to claim 11, wherein the alignment mark further comprises a third area comprising a third periodic structure, the third periodic structure being similar to the second periodic structure.

18. The alignment mark according to claim 17, wherein the first area is separated from both the second and third area by a gap.

19. The alignment mark according to claim 17, wherein the first area is touching both the second and third area.

20. The alignment mark according to claim 11, wherein mark lines are formed by a plurality of sub-segment lines extending parallel or perpendicular with respect to the scribe lane direction.

21. The alignment mark according to claim 11, where mark lines are formed by a plurality of periodic sub-segment lines.

22. The alignment mark according to claim 11, wherein the scribe lane direction is substantially parallel to or perpendicular to the scanning direction.

23. An alignment mark comprising a periodic structure formed by mark lines, the alignment mark being formed in a scribe lane of a substrate, the scribe lane extending in a scribe lane direction, the alignment mark comprising:
 a first area comprising a first periodic structure formed by first mark lines extending in a first direction, the first direction being at a first angle α with respect to the scribe lane direction, wherein 0°<α<90°; and
 a second area comprising a second periodic structure formed by second mark lines extending in a second direction, the second direction being at a second angle β with respect to the scribe lane direction, wherein −90°≦β<0°;
 wherein the first mark lines have a first period and the second mark lines have a second period, the first period being substantially identical to the second period,
 wherein a line end of each first mark line connects to a line end of an adjacent second mark line, and
 wherein the first direction is not perpendicular to the second direction.

24. The alignment mark according to claim 23, wherein a position of a line end of each first mark line coincides with a same position of a line end of an adjacent second mark line so as to form a concatenated line of the first mark line and the second mark line.

25. The alignment mark according to claim 23, wherein the alignment mark further comprises a third area comprising a third periodic structure, the third periodic structure being similar to the first periodic structure, and wherein a further line end of each second mark line connects to a line end of an adjacent third mark line.

26. The alignment mark according to claim 23, wherein the first angle α is substantially equal to minus the second angle β, α=−β.

27. The alignment mark according to claim 23, wherein the first angle α substantially differs from the second angle β and the second angle β is substantially equal to −90°.

28. The alignment mark according to claim 23, wherein −90°<β<0°.

29. The alignment mark according to claim 23, wherein mark lines are formed by a plurality of sub-segment lines extending parallel or perpendicular with respect to the scribe lane direction.

30. The alignment mark according to claim 23, where mark lines are formed by a plurality of periodic sub-segment lines.

31. The alignment mark according to claim 23, wherein the scribe lane direction is substantially parallel to or perpendicular to the scanning direction.

32. A substrate comprising an alignment mark, the alignment mark comprising a periodic structure formed by mark lines, the alignment mark being formed in a scribe lane of a substrate, the scribe lane extending in a scribe lane direction, the alignment mark comprising:
   a first area comprising a first periodic structure formed by first mark lines extending in a first direction, the first direction being at a first angle $\alpha$ with respect to the scribe lane direction, wherein $0°<\alpha<90°$; and
   a second area comprising a second periodic structure formed by second mark lines extending in a second direction, the second direction being at a second angle $\beta$ with respect to the scribe lane direction, wherein $-90°<\beta<0°$,
   wherein the first periodic structure has a first period and the second periodic structure has a second period, the first period differing from the second period.

33. A substrate comprising an alignment mark, the alignment mark comprising a periodic structure formed by mark lines, the alignment mark being formed in a scribe lane of a substrate, the scribe lane extending in a scribe lane direction, the alignment mark comprising:
   a first area comprising a first periodic structure formed by first mark lines extending in a first direction, the first direction being at a first angle $\alpha$ with respect to the scribe lane direction, wherein $0°<\alpha<90°$; and
   a second area comprising a second periodic structure formed by second mark lines extending in a second direction, the second direction being at a second angle $\beta$ with respect to the scribe lane direction, wherein $-90°\leq\beta<0°$;
   wherein the first mark lines have a first period and the second mark lines have a second period, the first period being substantially identical to the second period, and
   wherein a line end of the first mark lines connects to as line end of an adjacent ones of the second mark lines, and
   wherein the first direction is not normal to the second direction.

34. A substrate comprising an alignment mark, the alignment mark comprising a periodic structure formed by mark lines, the alignment mark being formed in a scribe lane of a substrate, the scribe lane extending in a scribe lane direction, the alignment mark comprising:
   a first area comprising a first periodic structure formed by first mark lines extending in a first direction, the first direction being at a first angle $\alpha$ with respect to the scribe lane direction, wherein $0°<\alpha<90°$; and
   a second area comprising a second periodic structure formed by second mark lines extending in a second direction, the second direction being at a second angle $\beta$ with respect to the scribe lane direction, wherein $-90°\leq\beta<0°$;
   wherein the first periodic structure formed by first mark lines touches the second periodic structure formed by second mark lines, and
   wherein the first direction is not perpendicular to the second direction.

* * * * *

UNITED STATES PATENT AND TRADEMARK OFFICE
CERTIFICATE OF CORRECTION

PATENT NO.        : 8,208,121 B2
APPLICATION NO.   : 12/363320
DATED             : June 26, 2012
INVENTOR(S)       : Bijnen et al.

It is certified that error appears in the above-identified patent and that said Letters Patent is hereby corrected as shown below:

Title Page, Item (57), Abstract, please after "lane direction:" delete "-90° $\leqq \beta < 0°$" and replace with "-90° $\leq \beta < 0°$"

In claim 1, column 23, line 14, please delete "-90° $< \beta < 0°$" and insert -- -90° $\leq \beta < 0°$ --

In claim 11, column 23, line 59, please delete "-90° $\leqq \beta < 0°$" and insert -- -90° $\leq \beta < 0°$ --

In claim 23, column 24, line 41, please delete "-90° $\leqq \beta < 0°$" and insert -- -90° $\leq \beta < 0°$ --

In claim 32, column 25, line 23, please delete "-90° $< \beta < 0°$" and insert -- -90° $\leq \beta < 0°$ --

In claim 33, column 26, line 7, please delete "-90° $\leqq \beta < 0°$" and insert -- -90° $\leq \beta < 0°$ --

In claim 34, column 26, line 27, please delete "-90° $\leqq \beta < 0°$" and insert -- -90° $\leq \beta < 0°$ --

Signed and Sealed this
Eleventh Day of September, 2012

David J. Kappos
*Director of the United States Patent and Trademark Office*